(12) United States Patent
Abarra

(10) Patent No.: US 11,823,880 B2
(45) Date of Patent: Nov. 21, 2023

(54) TARGET STRUCTURE AND FILM FORMING APPARATUS

(71) Applicant: Tokyo Electron Limited, Tokyo (JP)

(72) Inventor: Einstein Noel Abarra, Tokyo (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 16/929,347

(22) Filed: Jul. 15, 2020

(65) Prior Publication Data

US 2021/0020419 A1 Jan. 21, 2021

(30) Foreign Application Priority Data

Jul. 18, 2019 (JP) .................................. 2019-133148

(51) Int. Cl.
*H01J 37/34* (2006.01)
*C23C 14/34* (2006.01)

(52) U.S. Cl.
CPC ...... *H01J 37/3435* (2013.01); *C23C 14/3407* (2013.01); *H01J 37/3414* (2013.01); *H01J 37/3497* (2013.01)

(58) Field of Classification Search
CPC ............. H01J 37/3497; H01J 37/3435; H01J 37/3414; C23C 14/3414; C23C 14/3407
See application file for complete search history.

(56) References Cited

U.S. PATENT DOCUMENTS

| 4,209,375 A | * | 6/1980 | Gates ................. B23K 35/3013 |
| | | | 204/192.15 |
| 4,826,584 A | * | 5/1989 | dos Santos Pereiro Ribeiro ........ |
| | | | H01J 37/3497 |
| | | | 204/298.12 |
| 8,715,471 B2 | * | 5/2014 | Krempel-Hesse .. H01J 37/3408 |
| | | | 204/298.12 |

FOREIGN PATENT DOCUMENTS

| CN | 101516157 A | | 8/2009 | |
| CN | 102420092 A | | 4/2012 | |
| JP | H06-108241 A | | 4/1994 | |
| JP | 07-021760 U | | 4/1995 | |
| JP | H09-087836 A | | 3/1997 | |
| JP | 2000073164 A | * | 3/2000 | ........... B23K 20/122 |
| JP | 2000169962 A | * | 6/2000 | |
| JP | 2000309867 A | * | 11/2000 | |
| JP | 2003-328119 A | | 11/2003 | |
| JP | 2006-526073 A | | 11/2006 | |
| JP | 2008-308728 A | | 12/2008 | |
| KR | 10-2002-0022502 A | | 3/2002 | |

* cited by examiner

*Primary Examiner* — Michael A Band
(74) *Attorney, Agent, or Firm* — Venjuris, P.C.

(57) ABSTRACT

A target structure includes a target, a cooling jacket having a flow path through which a heat exchange medium flows, and a backing plate. The target is bonded to one surface of the cooling jacket. A remaining surface of the cooling jacket and the backing plate are bonded in a peripheral portion, and are not bonded in a non-bonding region inside the peripheral portion.

18 Claims, 3 Drawing Sheets

TARGET STRUCTURE AND FILM FORMING APPARATUS

CROSS-REFERENCE TO RELATED APPLICATIONS

This application is based on and claims priority from Japanese Patent Application No. 2019-133148, filed on Jul. 18, 2019 with the Japan Patent Office, the disclosure of which is incorporated herein in its entirety by reference.

TECHNICAL FIELD

The present disclosure relates to a target structure and a film forming apparatus.

BACKGROUND

In a manufacturing process of a semiconductor device, a film forming apparatus is used to form a metal film on a substrate by sputtering.

Japanese Utility Model Laid-Open Publication No. 07-021760 discloses the structure of a cathode which includes an electrode formed by coupling a first member to which a target is attached and a second member to each other, for example, by bonding. The cathode has a structure in which a passage through which a cooling medium flows is formed in a coupling portion between the first member and the second member.

To this end, according to an aspect, there is provided a target structure including a target, a cooling jacket having a flow path through which a heat exchange medium flows, and a backing plate. The target is bonded to one surface of the cooling jacket, and a remaining surface of the cooling jacket and the backing plate are bonded in a peripheral portion, and are not bonded in a non-bonding region inside the peripheral portion.

The foregoing summary is illustrative only and is not intended to be in any way limiting. In addition to the illustrative aspects, embodiments, and features described above, further aspects, embodiments, and features will become apparent by reference to the drawings and the following detailed description.

DESCRIPTION OF EMBODIMENT

Figure 1:
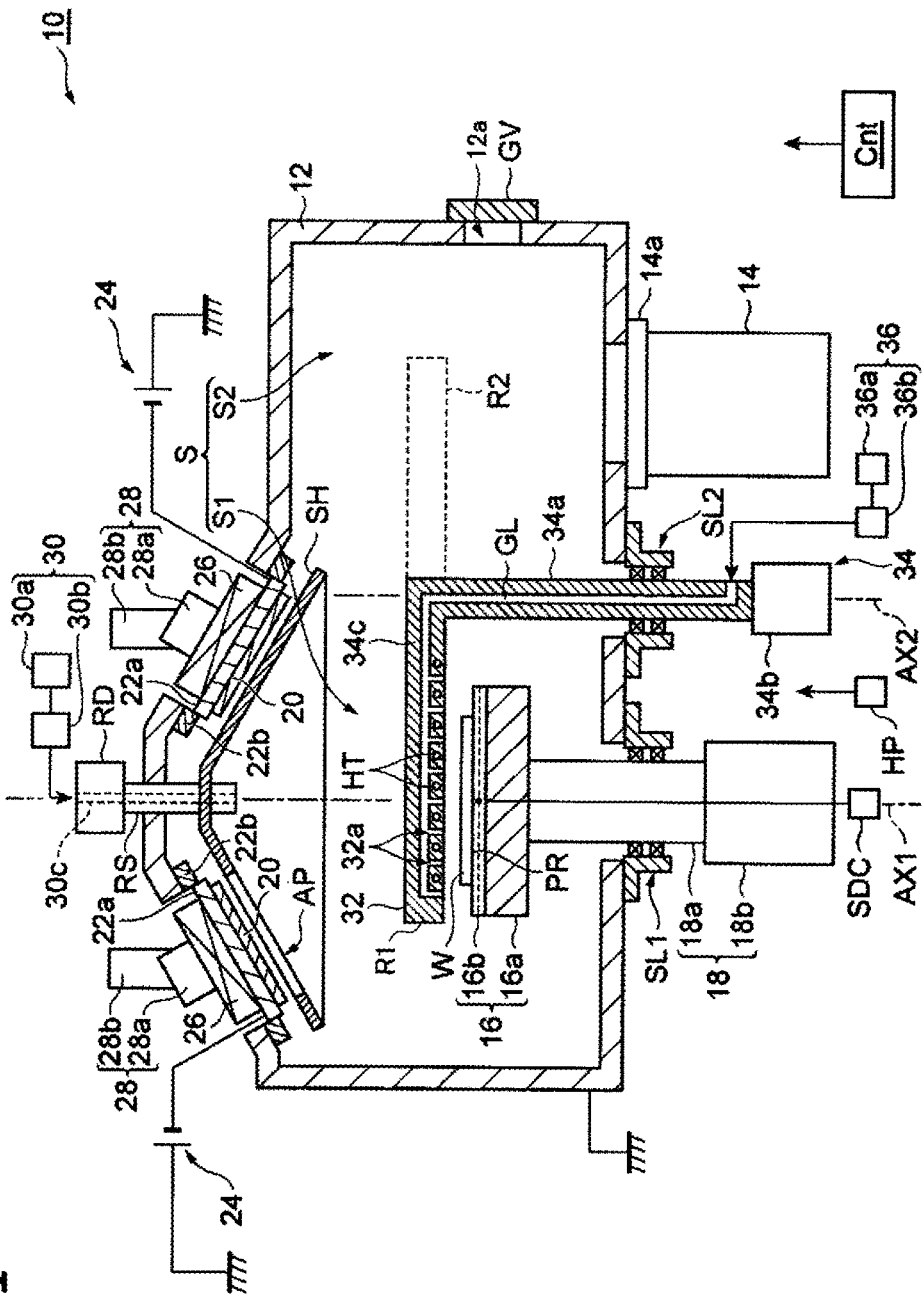
FIG. 1 is a schematic cross-sectional view illustrating an example of a film forming apparatus according to the present embodiment.

In the following detailed description, reference is made to the accompanying drawing, which form a part hereof. The illustrative embodiments described in the detailed description, drawing, and claims are not meant to be limiting. Other embodiments may be utilized, and other changes may be made without departing from the spirit or scope of the subject matter presented here.

Hereinafter, embodiments for carrying out the present disclosure will be described with reference to the drawings. In each drawing, the same reference numerals are given to the same components, and a redundant description thereof may be omitted.

A film forming apparatus 10 according to the present embodiment will be described with reference to FIG. 1. FIG. 1 is a schematic longitudinal cross-sectional view of the film forming apparatus 10 according to the present embodiment. The film forming apparatus 10 according to the present embodiment is a physical vapor deposition (PVD) apparatus that forms a metal film by depositing a material on a semiconductor wafer (hereinafter, simply referred to as a wafer W) serving as a substrate.

The film forming apparatus 10 includes a processing container 12. The processing container 12 is formed of, for example, aluminum and connected to a ground potential. The processing container 12 defines a space S therein. An exhaust device 14 is connected to the bottom of the processing container 12 to reduce the pressure of the space S via an adapter 14a. An opening 12a for the transport of the wafer W is formed in a sidewall of the processing container 12. Further, a gate valve GV is provided along the sidewall of the processing container 12 to open and close the opening 12a.

A stage 16 is provided within the processing container 12. The stage 16 has a base 16a and an electrostatic chuck 16b. The base 16a is formed of, for example, aluminum and has a substantially disc shape. The base 16a may be provided with a temperature control mechanism (not illustrated) that controls the temperature of the wafer W placed on the stage 16 by controlling the temperature of the base 16a. As the temperature control mechanism, for example, a coolant flow path (not illustrated) through which a coolant circulates may be formed inside the base 16a. The electrostatic chuck 16b is provided on the base 16a. The electrostatic chuck 16b has a dielectric film and an electrode provided as an inner layer of the dielectric film. A DC power supply SDC is connected to the electrode of the electrostatic chuck 16b. The wafer W placed on the electrostatic chuck 16b is attracted to the electrostatic chuck 16b by the electrostatic force generated by the electrostatic chuck 16b. A region on the upper surface of the electrostatic chuck 16b where the wafer W is placed constitutes a placing region PR for the wafer W.

The stage 16 is connected to a stage driving mechanism 18. The stage driving mechanism 18 includes a support shaft 18a and a driving device 18b. The support shaft 18a is a substantially columnar member. The upper end of the support shaft 18a is coupled to the stage 16. The center axis of the support shaft 18a substantially coincides with an axis AX1 extending along the vertical direction. The axis AX1 is an axis that passes through the center of the placing region PR, i.e., the center of the stage 16 in the vertical direction. The support shaft 18a extends from directly below the stage 16 to the outside of the processing container 12 through the bottom of the processing container 12. The lower end of the support shaft 18a is connected to the driving device 18b outside the processing container 12. The driving device 18b generates power for rotating and moving the support shaft 18a up and down. This power causes the stage 16 to rotate about the axis AX1 as the support shaft 18a rotates and causes the stage 16 to move up and down as the support shaft 18a moves up and down. A sealing member SL1 is provided between the support shaft 18a and the bottom of the processing container 12. The sealing member SL1 seals a gap between the bottom of the processing container 12 and the support shaft 18a such that the support shaft 18a may rotate and move up and down. Such a sealing member SL1 may be, for example, a magnetic fluid seal.

The film forming apparatus 10 includes a plurality of targets (cathode targets) 20 above the stage 16. Each of the plurality of targets 20 has a substantially rectangular flat plate shape. The plurality of targets 20 are arranged substantially evenly along a circle centered on the axis AX1. Further, the plurality of targets 20 are arranged so as to be inclined with respect to the axis AX1 so that the surface of the target 20 (see a sputtering surface 111 in FIG. 2 to be described later) faces the stage 16. The material of the targets 20 is arbitrarily selected according to the type of a film to be formed, and the plurality of targets 20 may be formed of different metal materials, respectively, or some or all of the targets 20 may be formed of the same metal material.

Each of the plurality of targets 20 is held by a metallic holder 22a. The holder 22a is supported on the top of the processing container 12 via an insulating member 22b. A power supply 24 is connected to each of the plurality of targets 20 via the holder 22a. The power supply 24 applies a negative DC voltage to each of the plurality of targets 20. The power supply 24 may be a single power supply that selectively applies a voltage to the plurality of targets 20, or may be a plurality of power supplies connected to the plurality of targets 20, respectively.

A shutter SH having an opening AP is provided between the plurality of targets 20 and the stage 16. The shutter SH is shaped to follow a conical plane having the axis AX1 as the center axis thereof, and extends so as to face the surfaces of the plurality of targets 20. The opening AP may selectively expose one of the plurality of targets 20 to the stage 16. A rotation shaft RS is coupled to the central portion of the shutter SH. The rotation shaft RS is a substantially columnar member. The center axis of the rotation shaft RS substantially coincides with the axis AX1. One end of the rotation shaft RS is connected to the central portion of the shutter SH within the processing container 12. Further, the rotation shaft RS extends from the inside of the processing container 12 to the outside of the processing container 12 through the top of the processing container 12. The other end of the rotation shaft RS is connected to a driving device RD outside the processing container 12. The driving device RD generates power for rotating the rotation shaft RS. As the rotation shaft RS rotates about the axis AX1 by this power, the shutter SH may rotate about the axis AX1. The rotation of the shutter SH enables adjustment of the position of the opening AP in the circumferential direction.

The film forming apparatus 10 includes a plurality of magnets (cathode magnets) 26 corresponding to the plurality of targets 20, respectively. The magnet 26 is provided outside the processing container 12 so as to face the target 20 via the holder 22a.

The film forming apparatus 10 includes a plurality of scanning mechanisms 28 for scanning the plurality of magnets 26, respectively. Each of the plurality of scanning mechanisms 28 may scan the corresponding magnet 26 among the plurality of magnets 26 in the tangential direction of a circle centered on the center axis AX1. The scanning mechanism 28 includes a guide part 28a and a driving device 28b. The guide part 28a is a guide body such as a rail extending in the tangential direction. The driving device 28b generates power to move the magnet 26 along the guide part 28a.

The film forming apparatus 10 includes a gas supply unit 30 that supplies a gas into the processing container 12. The gas supply unit 30 includes a gas source 30a, a flow rate controller 30b such as a mass flow controller, and a gas introduction part 30c. The gas source 30a is a source of a gas to be excited in the processing container 12, and is, for example, a source of Ar gas. The gas source 30a is connected to the gas introduction part 30c via the flow rate controller 30b. The gas introduction part 30c is a gas line that introduces the gas from the gas source 30a into the processing container 12. The gas introduction part 30c extends along the axis AX1.

When the gas is supplied from the gas supply unit 30 into the processing container 12 and a voltage is applied to the target 20 exposed from the opening AP by the power supply 24, the gas supplied into the processing container 12 is excited. Further, a magnetic field is generated in the vicinity of the target 20 by the corresponding magnet 26, causing concentration of plasma. When positive ions in the plasma collide with the target 20, a material is emitted from the target 20. Further, by scanning the magnet 26 by the scanning mechanism 28, the position on the surface of the target 20 at which the positive ions in the plasma collide is scanned. Thus, the material constituting the target 20 is deposited on the wafer W.

Further, the film forming apparatus 10 may further include a head 32. The head 32 is configured to inject an oxidizing gas toward the stage 16 for oxidizing a metal deposited on the wafer W.

The head 32 is connected to a head driving mechanism 34 that supports the head 32 using a shaft. The head driving mechanism 34 has a support shaft 34a and a driving device 34b. The support shaft 34a has a substantially columnar shape. The center axis of the support shaft 34a substantially coincides with an axis AX2. The axis AX2 is substantially parallel to the axis AX1, and extends in the vertical direction on the lateral side of the stage 16. The head 32 has a substantially disc shape. The distance between the center position of the head 32 and the axis AX2 is substantially equal to the distance between the axis AX1 and the axis AX2.

The support shaft 34a extends from the inside of the processing container 12 to the outside of the processing container 12. A sealing member SL2 is provided between the support shaft 34a and the bottom of the processing container 12. The sealing member SL2 seals a gap between the bottom of the processing container 12 and the support shaft 34a such that the support shaft 34a may rotate. Such a sealing member SL2 may be, for example, a magnetic fluid seal.

The upper end of the support shaft 34a is connected to one end of a connecting part 34c. The connecting part 34c extends in a direction orthogonal to the axis AX2. The other end of the connecting part 34c is coupled to the peripheral edge of the head 32. Further, the lower end of the support shaft 34a is connected to the driving device 34b. The driving device 34b generates power for rotating the support shaft 34a. The head 32 swings around the axis AX2 as the support shaft 34a rotates.

Specifically, the head 32 moves between a first region R1 and a second region R2 according to an operation of the head driving mechanism 34. The first region R1 is a region above the stage 16 and is a region within a space 51 between the plurality of targets 20 and the stage 16. Further, the second region R2 is a region apart from the space 51, i.e., a region in a space S2 different from the space 51.

A gas line GL for an oxidizing gas is formed in the support shaft 34a, the connecting part 34c, and the head 32. One end of the gas line GL is provided outside the processing container 12. A gas supply unit 36 is connected to the one end of the gas line GL. The gas supply unit 36 includes a gas source 36a and a flow rate controller 36b such as a mass flow controller. The gas source 36a is a source of an oxidizing gas, and may be, for example, a source of $O_2$ gas. The gas source 36a is connected to the one end of the gas line GL via the flow rate controller 36b.

The gas line GL in the head 32 is connected to a plurality of gas injection ports 32a provided in the head 32. In the present embodiment, the plurality of gas injection ports 32a may be arranged so as to be distributed over substantially the entire area of the disc-shaped head 32. Further, the plurality of gas injection ports 32a may be arranged in a direction orthogonal to the axis AX2. Further, in the present embodiment, the head 32 has a plane size larger than the placing region PR of the stage 16. That is, the head 32 is sized to be able to be interposed between the stage 16 and the plurality of targets 20 to cover the wafer W. The head 32 may have an elongated planar shape extending in the direction in which the plurality of gas injection ports 32a are arranged.

Further, as illustrated in FIG. 1, in the present embodiment, the head 32 is provided with a heater HT. The heater HT may be a heater based on any one type of various heating methods such as lamp radiation, Joule resistance heating, induction heating, and microwave heating. A heater power supply HP is connected to the heater HT, and the heater HT generates heat by electric power from the heater power supply HP.

According to the film forming apparatus 10 configured as described above, deposition of a metal on the wafer W and oxidization of the metal may be performed within the same processing container 12. Specifically, a metal may be deposited on the wafer W by expelling the metal from the target 20 in a state where the head 32 is arranged in the second region R2. Further, the deposited metal may be oxidized by supplying an oxidizing gas toward the wafer W in a state where the head 32 is arranged in the first region R1. As such, according to the film forming apparatus 10, since deposition of the metal on the wafer W and oxidization of the metal may be performed within the same processing container 12, the time necessary to form a metal oxide layer may be shortened.

Further, the film forming apparatus 10 may heat the oxidizing gas by the heater HT during a metal oxidation processing. Thus, the oxidation of the metal may be promoted, which may shorten the time required for the metal oxidation processing.

Further, according to the film forming apparatus 10, prior to the deposition of the metal, a processing of scraping the surface of the target 20, i.e., pre-sputtering may be performed in a state where the wafer W is covered by the head 32 arranged in the first region R1. Accordingly, the film forming apparatus 10 may reduce or prevent contamination of the wafer W during pre-sputtering.

The film forming apparatus 10 may include a control unit Cnt. The control unit Cnt controls each component of the film forming apparatus 10. The control unit Cnt is, for example, a computer device, and may include an input device such as a keyboard or a touch panel, a storage unit such as a memory that stores a recipe, a central processing unit (CPU), and an output interface for outputting a control signal to each component of the film forming apparatus 10.

Specifically, the control unit Cnt may control the rotational position of the shutter SH by sending a control signal to the driving device RD. Thus, the selected target 20 among the plurality of targets 20 may be exposed to the stage 16 through the opening AP.

Further, the control unit Cnt may also send a control signal to the flow rate controller 30b of the gas supply unit 30. Thus, a predetermined flow rate of gas is supplied from the gas supply unit 30 into the processing container 12.

Further, the control unit Cnt may send a control signal to the exhaust device 14. Thus, the pressure inside the processing container 12 is set to a predetermined pressure. Further, the control unit Cnt may send a control signal to the driving device 34b. Thus, the position of the head 32 is set. For example, when depositing, on the wafer W, the material emitted from the target 20 exposed through the opening AP, the head 32 may be positioned in the second region R2. Further, when oxidizing the metal deposited on the wafer W, the head 32 may be positioned in the first region R1. Further, the control unit Cnt may send a control signal to the heater power supply HP. Thus, the head 32 may be heated, so that the oxidizing gas flowing through the head 32 may be heated.

Furthermore, the control unit Cnt may send a control signal to the power supply 24. Thus, a negative DC voltage may be applied to the target 20. Further, the control unit Cnt may send a control signal to the driving device 28b of each of the plurality of scanning mechanisms 28. Thus, the magnet 26 may be scanned.

Figure 2:
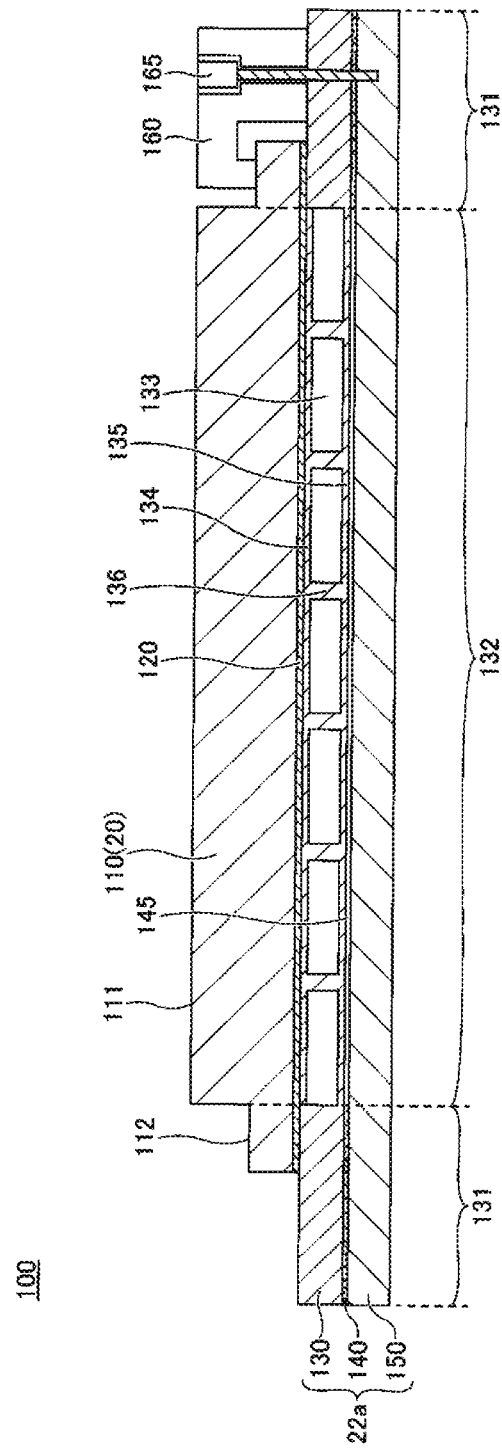
FIG. 2 is a schematic cross-sectional view illustrating an example of a target structure according to the present embodiment.

Next, a target structure 100 according to the present embodiment will be further described with reference to FIG. 2. FIG. 2 is a schematic cross-sectional view illustrating an example of the target structure 100 according to the present embodiment. FIG. 2 illustrates the target structure 100 oriented such that the sputtering surface 111 on which a target 110 is sputtered by plasma faces upward.

The target structure 100 includes the target 110, a bonding layer 120, a cooling jacket 130, a bonding layer 140, and a backing plate 150. The target 20 illustrated in FIG. 1 corresponds to the target 110 illustrated in FIG. 2. Further, the holder 22a illustrated in FIG. 1 corresponds to the cooling jacket 130, the bonding layer 140, and the backing plate 150 illustrated in FIG. 2.

The target 110 is formed of a film forming metal (e.g., Ti) that is formed as a film on the wafer W. The target 110 has the sputtering surface 111 on which positive ions in plasma collide and a flange 112 formed on the outer peripheral side thereof.

The bonding layer 120 conducts, for example, bonding of the back surface of the target 110 and the front surface of the cooling jacket 130. Specifically, the entire back surface of the target 110 is bonded to the front surface of the cooling jacket 130 by the bonding layer 120. Here, as described above with reference to FIG. 1, since plasma is concentrated by the magnetic field of the magnet 26, positive ions in the plasma locally collide with the sputtering surface 111 of the target 110, so that the sputtering surface 111 of the target 110 locally reaches a high temperature. By bonding the entire back surface of the target 110, the thermal conductivity between the target 110 and the cooling jacket 130 may be enhanced. Further, for the bonding layer 120, for example, a metal having a low melting point such as In or Sn is used. Thus, the target structure 100 is configured to enable replacement of the target 110 and to allow a structure including the cooling jacket 130, the bonding layer 140, and the backing plate 150 to be reused.

The cooling jacket 130 is formed of a metal having high heat conductivity, specifically, a metal (e.g., Cu) having higher heat conductivity than the target 110. Further, the cooling jacket 130 is configured to be more flexible and be easily deformed by an external force than the target 110, and is configured to be able to follow deformation due to thermal expansion of the target 110.

The cooling jacket 130 has a first region 131 and a second region 132. The first region 131 is a peripheral region on the outer peripheral side of the cooling jacket 130 when viewed from a direction perpendicular to the surface of the cooling jacket 130, and is a region outside the sputtering surface 111 of the target 110, in other words, a region outside a region where plasma is generated. The second region 132 is a region inside the first region 131, and is a region inside the sputtering surface 111 of the target 110, in other words, the region where plasma is generated.

A flow path 133 is formed in the second region 132 of the cooling jacket 130. The flow path 133 is surrounded by an upper plate 134, a lower plate 135, and a partition 136 for flow partition.

A heat exchange medium such as brine flows through the flow path 133 of the cooling jacket 130. Thus, when heat is input to the target 110 from plasma, the heat is transferred to the target 110, the bonding layer 120, the cooling jacket 130, and the heat exchange medium in the flow path 133, and the target 110 is cooled. This prevents the target 110 from melting due to the heat of the plasma.

The bonding layer 140 bonds the back surface of the cooling jacket 130 and the front surface of the backing plate 150 to each other by, for example, brazing. Here, the cooling jacket 130 and the backing plate 150 are bonded to each other by the bonding layer 140 in the first region 131. Meanwhile, the cooling jacket 130 and the backing plate 150 are not bonded to each other in the second region 132, and the second region 132 serves as a non-bonding region 145. In the non-bonding region 145, the back surface of the cooling jacket 130 and the front surface of the backing plate 150 may be in contact with each other, or there may be a gap surrounded by the back surface of the cooling jacket 130, the front surface of the backing plate 150, and the inner peripheral surface of the bonding layer 140.

The backing plate 150 is a member that supports the target structure 100, and is formed of a metal (e.g., stainless steel) having higher rigidity than the cooling jacket 130. Further, the backing plate 150 may have higher rigidity than the target 110. Further, a negative voltage is applied to the backing plate 150 from the power source 24 (see FIG. 1).

Further, a clamp member 160 that pushes the target 110 may be attached to the target structure 100. The clamp member 160 presses the flange 112 of the target 110. Further, the clamp member 160 is fixed to the backing plate 150 by a bolt 165. The clamp member 160 is arranged in the first region 131, and the flow path 133 is not provided below the clamp member 160 (in the first region 131 of the cooling jacket 130).

As described above, the target 110, the cooling jacket 130, and the backing plate 150 are formed of different metals. That is, the target structure 100 is configured by bonding different metals. Therefore, when heat is input from plasma at the time of generation of the plasma, the bonding layer 120 which conducts bonding of the target 110 and the cooling jacket 130 may peel off due to the difference in the coefficients of thermal expansion.

Meanwhile, according to the target structure 100 of the present embodiment, since the cooling jacket 130 is configured to be more easily deformed by an external force than the target 110, the cooling jacket 130 is deformed to follow the deformation of the target 110, so that peeling of the bonding layer 120 may be prevented. Thus, the target 110 may be suitably cooled, which may prevent the target 110 from melting due to the heat of the plasma.

Figure 3:
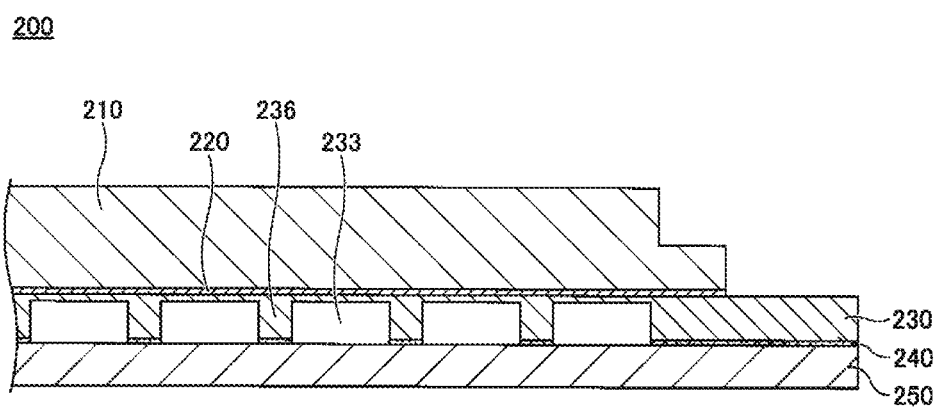
FIG. 3 is a schematic cross-sectional view illustrating an example of a target structure according to a reference example.

Here, a target structure 200 according to a reference example will be described with reference to FIG. 3. FIG. 3 is a schematic cross-sectional view of the target structure 200 according to the reference example. The target structure 200 includes a target 210, a bonding layer 220, a cooling jacket 230, a bonding layer 240, and a backing plate 250. Here, in the target structure 200, the lower end of a partition 236 of the cooling jacket 230 is bonded to the backing plate 250 by the bonding layer 240 so that a flow path 233 is formed. Other configurations are the same as those of the target structure 100 (see FIG. 2), and a redundant description will be omitted.

In the target structure 200 illustrated in FIG. 3, the partition 236 bonded to the backing plate 250 has rigidity to suppress deformation of the cooling jacket 230. Therefore, when the target 210 is deformed by the heat of plasma, the cooling jacket 230 may not follow the deformation, which may cause the target 210 to peel off from the cooling jacket 230.

Meanwhile, in the target structure 100 of the present embodiment, the second region 132 below the target 110 serves as the non-bonding region 145 where the cooling jacket 130 and the backing plate 150 are not bonded to each other. Thus, since the cooling jacket 130 may be deformed to follow the deformation of the target 110, the target 210 may be prevented from peeling off from the cooling jacket 230.

Here, when the target 110 is deformed, the temperature in the vicinity of the center of the sputtering surface 111 becomes high and deformation of the target 110 increases because of reciprocation of the magnet 26. Further, the target 110 is clamped by the flange 112, and deformation in the vicinity of the center of the sputtering surface 111 increases.

Here, in a plate member (solid member) having the thickness t, the width w, the length L, and the Young's modulus Y, the deformation amount d when the external force F is applied in the thickness direction to the center of the surface of the plate member may be expressed by the following equation.

$$d = \frac{L^3 F}{4wt^3 Y} \qquad \text{[Equation 1]}$$

That is, the shape (the thickness t, the width w, and the length) and the material (the Young's modulus Y) of the target 110 and the cooling jacket 130 are selected so that the deformation amount d of the cooling jacket 130 is greater than the deformation amount d of the target 110 when the same external force F is applied thereto. The thickness t, the width w, and the length L of the target 110 may be the thickness t, the width w, and the length L of the target 110 in the second region 132 excluding the flange 112. Further, the thickness t, width w, and length L of the cooling jacket 130 may be the thickness t, width w, and length L of the cooling jacket 130 in the second region 132. In other words, the thickness t, width w, and length L of the cooling jacket 130 may be the thickness t, width w, and length L of the cooling jacket 130 in the non-bonding region 145.

In the above equation, the ease of deformation is evaluated in a relationship between the entire cooling jacket 130 and the entire target 110, but the present disclosure is not limited thereto. The deformation amount d with respect to the external force F may be obtained in consideration of the flow path 133 (hollow structure) formed in the cooling jacket 130. The deformation amount d with respect to the external force F is smaller in the solid structure (plate member) than in the hollow structure (the cooling jacket 130 having the flow path 133). Therefore, when the cooling jacket 130 regarded as the plate member (solid structure) is more easily deformed than the target 110 by an external force, the cooling jacket 130 having the flow path 133 (hollow structure) is more easily deformed by an external force than the target 110.

Further, it may be determined whether or not the upper plate 134 of the flow path 133 of the cooling jacket 130 is more easily deformed by an external force than the target 110. Therefore, by suppressing peeling in a smaller area, peeling of the target 110 and the cooling jacket 130 may be suppressed as a whole.

Further, if the external force when the target 110 is deformed by the deformation amount $d_1$ is $F_1$ and the external force when the cooling jacket 130 is deformed by the same deformation amount $d_1$ is $F_2$, the difference between the forces ($F_1$-$F_2$) is the external force applied to the bonding layer 120. The shape (the thickness t, the width w, and the length L) and the material (Young's modulus Y) of the target 110 and the cooling jacket 130 are selected so that the difference between the forces ($F_1$-$F_2$) is smaller than the bonding force of the bonding layer 120. In addition, the deformation amount $d_1$ of the target 110 is determined based on the state when plasma is generated.

The non-bonding region 145 may be in an air atmosphere. Further, the non-bonding region 145 may be in a vacuum atmosphere. Further, the non-bonding region 145 may be in the atmosphere of the inside (space S) of the processing container 12. Further, a gas (e.g., an inert gas) may be supplied to the non-bonding region 145. The degree of deformation may be reduced by supplying a gas to the space surrounded by the back surface of the cooling jacket 130, the surface of the backing plate 150, and the bonding layer 140 to adjust the pressure in the space.

According to an aspect, it is possible to provide a target structure and a film forming apparatus which may suppress peeling of a bonding part of a target.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A target structure comprising:
    a target including a sputtering surface and a flange, the flange being formed on an outer peripheral side of the target;
    a cooling jacket including a first surface bonded to the target and a second surface opposite the first surface, the cooling jacket having a flow path through which a heat exchange medium flows;
    a backing plate, and
    a bonding layer bonding the second surface of the cooling jacket to the backing plate in a peripheral portion of the cooling jacket,
    wherein the second surface of the cooling jacket and the backing plate are not bonded in a non-bonding region inside the peripheral portion, the non-bonding region extending between opposing ends of the bonding layer, and
    the bonding layer is disposed only at a portion of the cooling jacket outside the sputtering surface of the target, and in a cross-sectional view taken along a direction perpendicular to the sputtering surface of the target, wherein a distance between the opposing ends of the bonding layer is equal to a width of the sputtering surface of the target such that the bonding layer overlaps the flange and the non-bonding region overlaps with the distance in the cross-sectional view; and
    wherein a gap surrounded by the second surface of the cooling jacket, a front surface of the backing plate and an inner peripheral surface of the bonding layer is formed in the non-bonding region, and the flow path is surrounded only by an upper plate, a lower plate, and two partitions of the cooling jacket in the cross-section view.

2. The target structure according to claim 1, wherein the peripheral portion is a region outside the sputtering surface of the target.

3. The target structure according to claim 2, wherein the flow path of the cooling jacket is formed inside the peripheral portion.

4. The target structure according to claim 3, wherein the cooling jacket is formed of a material having a thermal conductivity higher than that of the target.

5. The target structure according to claim 4, wherein the cooling jacket is more easily deformed by an external force than the target.

6. The target structure according to claim 5, wherein the backing plate is formed of a material having a rigidity higher than that of the cooling jacket.

7. The target structure according to claim 6, wherein the target is bonded to the first surface of the cooling jacket over an entire back surface of the target.

8. The target structure according to claim 7, further comprising:
    a clamp member configured to clamp the target,
    wherein the clamp member is clamped with a flange of the target extending to the peripheral portion.

9. The target structure according to claim 1, wherein the flow path of the cooling jacket is formed inside the peripheral portion.

10. The target structure according to claim 1, wherein the cooling jacket is formed of a material having a thermal conductivity higher than that of the target.

11. The target structure according to claim 1, wherein the cooling jacket is more easily deformed by an external force than the target.

12. The target structure according to claim 1, wherein the backing plate is formed of a material having a rigidity higher than that of the cooling jacket.

13. The target structure according to claim 1, wherein the target is bonded to the first surface of the cooling jacket over an entire back surface of the target.

14. The target structure according to claim 1, further comprising:
    a clamp member configured to clamp the target,
    wherein the clamp member is clamped with a flange of the target extending to the peripheral portion.

15. A film forming apparatus having the target structure according to claim 1.

16. The film forming apparatus according to claim 15, further comprising a processing container in which the target structure is disposed, wherein the non-bonding region is in an atmosphere of an inside of the processing container.

17. The target structure according to claim 1, the non-bonding region is in an air atmosphere.

18. The target structure according to claim 1, the non-bonding region is in a vacuum atmosphere.

* * * * *